(12) United States Patent
Jeon et al.

(10) Patent No.: US 11,516,912 B2
(45) Date of Patent: Nov. 29, 2022

(54) PRINTED CIRCUIT BOARD AND ELECTRONIC DEVICE HAVING THE SAME

(71) Applicant: Samsung Electronics Co., Ltd., Gyeonggi-do (KR)

(72) Inventors: Jongmin Jeon, Gyeonggi-do (KR); Eunseok Hong, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 17/125,512

(22) Filed: Dec. 17, 2020

(65) Prior Publication Data
US 2021/0195736 A1     Jun. 24, 2021

(30) Foreign Application Priority Data

Dec. 18, 2019    (KR) .................. 10-2019-0170081

(51) Int. Cl.
*H05K 1/03*        (2006.01)
*H05K 1/18*        (2006.01)
(Continued)

(52) U.S. Cl.
CPC .......... *H05K 1/0393* (2013.01); *H05K 1/036* (2013.01); *H05K 1/189* (2013.01); *H05K 3/02* (2013.01); *H05K 3/361* (2013.01); *H05K 3/4652* (2013.01)

(58) Field of Classification Search
CPC ...... H05K 1/0393; H05K 1/036; H05K 1/189; H05K 1/243; H05K 1/0284; H05K 1/144;
(Continued)

(56) References Cited

U.S. PATENT DOCUMENTS 7,217,994 B2    5/2007    Zhu et al.
7,411,281 B2    8/2008    Zhang
(Continued)

FOREIGN PATENT DOCUMENTS

JP       05-160574       6/1993
JP       2008-135550     6/2008
(Continued)

OTHER PUBLICATIONS

International Search Report dated Apr. 19, 2021 issued in counterpart application No. PCT/KR2020/018702, 8 pages.

*Primary Examiner* — Hoa C Nguyen
*Assistant Examiner* — John B Freal
(74) *Attorney, Agent, or Firm* — The Farrell Law Firm, P.C.

(57) ABSTRACT

Disclosed is a printed circuit board (PCB) module including a first PCB comprising a base PCB, a sidewall disposed on a periphery of the base PCB, and conductive vias penetrating the sidewall, a second PCB disposed on the sidewall to cover a cavity formed by the sidewall of the first PCB, and at least one electronic component disposed inside the cavity and located on the first PCB and/or the second PCB, wherein the sidewall comprises a first layer disposed on an upper face of the base PCB and constructed of an insulating member, a second layer disposed on the first layer and comprising a polyimide, a third layer disposed on the second layer and constructed of an insulating member, and a fourth layer disposed on the third layer and comprising a conductive member conductive with respect to the conductive vias.

10 Claims, 15 Drawing Sheets

(51) Int. Cl.
*H05K 3/46* (2006.01)
*H05K 3/36* (2006.01)
*H05K 3/02* (2006.01)

(58) Field of Classification Search
CPC ........ H05K 1/115; H05K 1/0366; H05K 1/09; H05K 1/181; H05K 2201/0154; H05K 2201/042; H05K 2201/09045; H05K 2201/09618; H05K 3/02; H05K 3/361; H05K 3/4697; G06F 1/1626; G06F 1/1658; G06F 1/183
See application file for complete search history.

(56) References Cited

U.S. PATENT DOCUMENTS

| | | | |
|---|---|---|---|
| 9,980,386 B1* | 5/2018 | Li | H05K 3/462 |
| 10,015,885 B2* | 7/2018 | Jung | H05K 3/30 |
| 10,153,219 B2 | 12/2018 | Jeon et al. | |
| 2012/0024583 A1* | 2/2012 | Lee | H05K 1/186 |
| | | | 29/852 |
| 2012/0181074 A1* | 7/2012 | Ishihara | H05K 3/46 |
| | | | 29/846 |
| 2016/0037624 A1* | 2/2016 | Yu | H05K 3/4655 |
| | | | 156/60 |
| 2016/0183363 A1* | 6/2016 | Lee | H05K 3/4691 |
| | | | 174/254 |
| 2016/0330840 A1* | 11/2016 | Leitgeb | H05K 1/162 |
| 2017/0265298 A1 | 9/2017 | Zhang et al. | |

FOREIGN PATENT DOCUMENTS

| | | |
|---|---|---|
| KR | 10-0679070 | 2/2007 |
| KR | 101100034 | 12/2011 |
| KR | 20120070290 | 6/2012 |

* cited by examiner

PRINTED CIRCUIT BOARD AND ELECTRONIC DEVICE HAVING THE SAME

CROSS-REFERENCE TO RELATED APPLICATION(S)

This application is based on and claims priority under 35 U.S.C. § 119 to Korean Patent Application No. 10-2019-0170081, filed on Dec. 18, 2019, in the Korean Intellectual Property Office, the disclosure of which is incorporated herein by reference in its entirety.

BACKGROUND

1. Field

The disclosure relates generally to a printed circuit board (PCB), and more particularly, to an electronic device having the PCB.

2. Description of Related Art

A PCB is generally constructed by printing a circuit line pattern on an electric insulating board by using a conductive material such as copper, and refers to a board capable of mounting an electronic component. That is, on the PCB, a location of mounting each component is determined to intensively mount various electronic components, and a circuit line pattern for coupling the components is printed.

Since several PCBs are disposed to face each other, an electronic device including the PCBs can be implemented to be light, thin, short, and small with improved mounting density. An interposer or a connector may be used so that the plurality of PCBs are coupled to face each other. For example, since the interposer is disposed between two PCBs, an electronic component may be mounted in a secured internal space. In addition, the interposer may use a plurality of conductive vias to electrically couple electronic components mounted on the two PCBs.

In order for the two PCBs to be laminated through the interposer, a surface mount technology is used for attaching the interposer to each of the PCBs. In this process, warpage tends to occur in the PCB, which tends to cause a defect such as a crack of a solder ball.

Furthermore, a structure capable of functioning as the interposer is constructed on the PCB, in which structure a cavity having a protection region is formed inside the PCB. However, when a protection region is formed in such a manner, a processing region may be formed incorrectly due to a deterioration of heat resistance and film adhesion. In addition, surface quality may be degraded due to a resist residue and a processing depth variation, and it may be difficult to form and manage a large-area cavity due to an increase in flatness distribution within a unit region.

Therefore, there is a need in the art for a PCB including a structure capable of functioning as an interposer that has fewer surface mounting iterations, and a related method of manufacturing the PCB.

In addition, there is a need in the art for a more accurately formed protection region inside the PCB, to prevent deterioration of heat resistance and film adhesion.

SUMMARY

This disclosure is provided to address at least the above-mentioned problems and/or disadvantages and to provide at least the advantages described below.

Accordingly, an aspect of the disclosure is to provide a process by which a structure capable of functioning as the interposer is constructed on the PCB, in which structure a high-quality cavity is formed inside the PCB.

Another aspect of the disclosure is to form the cavity (e.g., laser processing, depth routing) by covering a circuit exposed to the cavity with an improved film or resist to protect the circuit.

Another aspect of the disclosure is to provide a method of constructing an interposer integrally on one of two PCBs, thereby decreasing the number of surface mounting processes.

In accordance with an aspect of the disclosure, a PCB module may include a first PCB comprising a base PCB, a sidewall disposed on a periphery of the base PCB, and conductive vias penetrating the sidewall, a second PCB disposed on the sidewall to cover a cavity formed by the sidewall of the first PCB, and at least one electronic component disposed inside the cavity and located on the first PCB and/or the second PCB, wherein the sidewall comprises a first layer disposed on an upper face of the base PCB and constructed of an insulating member, a second layer disposed on the first layer and comprising a polyimide, a third layer disposed on the second layer and constructed of an insulating member, and a fourth layer disposed on the third layer and comprising a conductive member conductive with respect to the conductive vias.

In accordance with another aspect of the disclosure, a method of manufacturing a PCB module having a first PCB and a second PCB may include laminating a first layer comprising an opening on a base PCB of the first PCB, laminating a second layer in a cured state on the first layer, laminating a third layer constructed of a prepreg on the second layer, laminating a fourth layer comprising a conductive layer on the third layer, manufacturing the first PCB by removing a portion corresponding to the opening from the second layer to the fourth layer, and surface-mounting the second PCB on the fourth layer of the first PCB.

BRIEF DESCRIPTION OF THE DRAWINGS

The above and other aspects, features and advantages of certain embodiments of the disclosure will be more apparent from the following detailed description, taken in conjunction with the accompanying drawings, in which.

DETAILED DESCRIPTION

Figure 1:
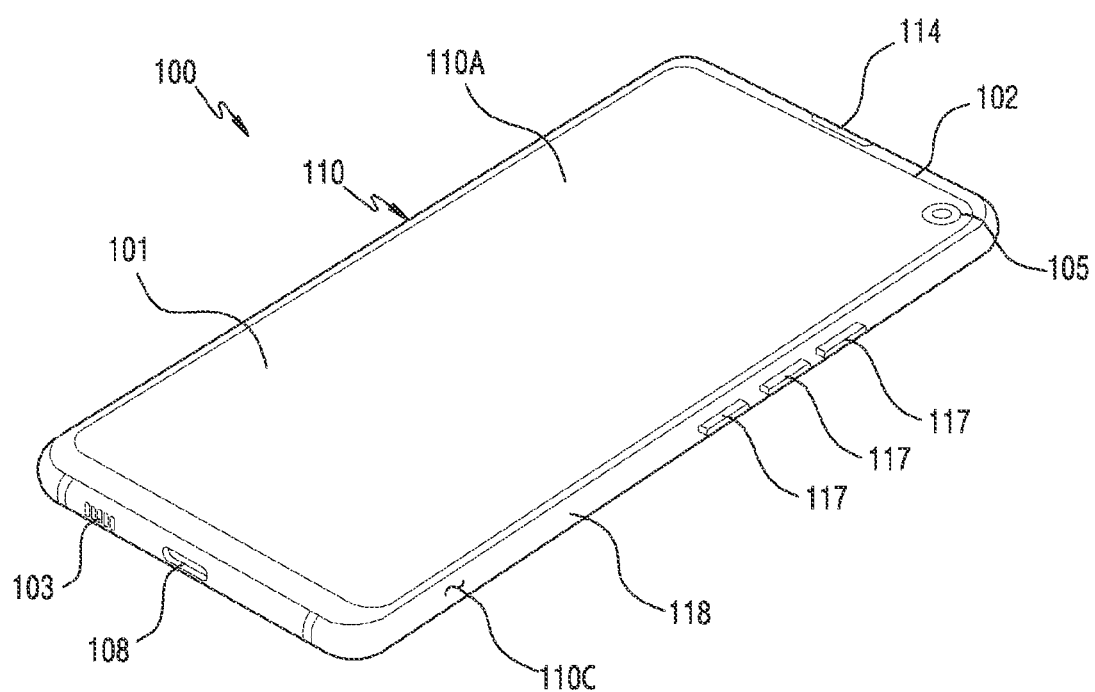
FIG. 1 is a perspective view illustrating an electronic device according to an embodiment.

Hereinafter, embodiments of the disclosure will be described in detail with reference to the accompanying drawings. Detailed descriptions of known functions and/or configurations will be omitted for the sake of clarity and conciseness.

An electronic device according to embodiments may be one of various types of electronic devices. An electronic device may include a portable communication device (e.g., a smart phone), a computer device, a portable multimedia device, a portable medical device, a camera, a wearable device, or a home appliance. The electronic device is not limited to those described above.

It should be appreciated that the terms used herein are not intended to limit the technological features set forth herein to particular embodiments and include various changes, equivalents, or replacements for a corresponding embodiment. In the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and do not limit the components in importance or order. It is to be understood that if an element (e.g., a first element) is referred to, with or without the term "operatively" or "communicatively", as "coupled with," "coupled to," "connected with," or "connected to" another element (e.g., a second element), this indicates that the first element may be coupled with the second element directly (e.g., wiredly), wirelessly, or via a third element.

In the disclosure, since a PCB is constructed integrally with the interposer, warpage of a circuit board can be suppressed, which decreases a possibility that a defect such as solder ball cracking occurs. Accordingly, the PCB is manufactured with a high yield.

Figure 2:
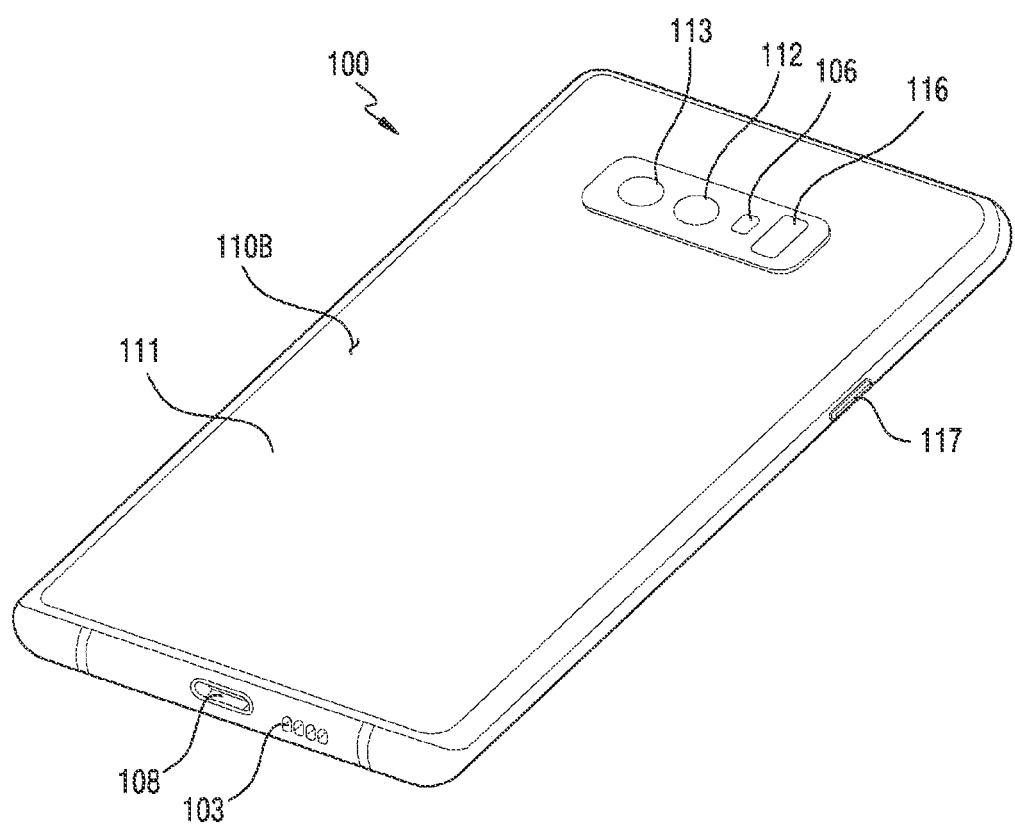
FIG. 2 is a rear perspective view illustrating an electronic device according to an embodiment.

FIG. 1 is a perspective view illustrating an electronic device 100 according to an embodiment. FIG. 2 is a rear perspective view illustrating the electronic device 100 of FIG. 1 according to an embodiment.

Referring to FIG. 1 and FIG. 2, the electronic device 100 may include a housing 110 including a first face (or a front face) 110A, a second face (or a rear face) 110B, and a side face 110C surrounding a space between the first face 110A and the second face 110B. In another embodiment, the housing may constitute part of the first face 110A, second face 110B, and third face 110C of FIG. 1.

The first face 110A may be constructed of a front plate 102 (e.g., a polymer plate or a glass plate having various coating layers) which is at least partially transparent. The front plate 102 may include a curved portion seamlessly extending by being bent from the first face 110A toward a rear plate 111 in at least one side edge portion.

The second face 110B may be constructed of the rear plate 111 which is opaque. For example, the rear plate 111 may be constructed of coated or colored glass, ceramic, polymer, metallic materials (e.g. aluminum, stainless steel (STS), or magnesium) or a combination of at least two of these materials. The rear plate 111 may include a curved portion seamlessly extending by being bent from the second face 110B toward the front plate 102 in at least one side edge portion.

The side face 110C may be constructed of a side bezel structure (or a side member or a sidewall) 118 bonded to the front plate 102 and the rear plate 111 and including metal and/or polymer. The rear plate 111 and the side bezel structure 118 may be constructed integrally and may include the same material (e.g., a metallic material such as aluminum).

The electronic device 100 may include at least one or more of a display 101, audio modules 103 and 114, a sensor module, a camera module 105, at least one key input device 117, and a connector hole 108. The electronic device 100 may omit at least one of components or other components may be additionally included. For example, a sensor such as a proximity sensor or an illumination sensor may be integrated to the display 101 in a region provided by the front plate 102, or may be disposed at a location adjacent to the display 101.

The electronic device 100 may further include a light emitting element disposed at a location adjacent to the display 101 in the region provided by the front plate 102. The light emitting element may provide state information of the electronic device 100 in an optical form, may provide a light source interworking with an operation of the camera module 105, and may include a light-emitting diode (LED), an Infrared (IR) LED, and a xenon lamp.

The display 101 may be exposed through some portions of the front plate 102. An edge of the display 101 may be constructed to be substantially the same as a shape of a periphery (e.g., a curved face) adjacent to the front plate 102. Alternatively, in order to expand an area in which the display 101 is exposed, the display 110 and the front plate 102 may be constructed to have substantially the same interval between peripheries thereof. A portion of a screen display region of the display 101 may have a recess or opening, and may include other electronic components the camera module 105 and a proximity sensor or illumination sensor, which are aligned with the recess or the opening.

At least one of camera modules 112 and 113, a finger print sensor 116, and a flash 106 may be included in a rear face of the screen display region of the display 101, or the display 101 may be disposed adjacent to or joined with a touch sensing circuit, a pressure sensor capable of measuring touch strength (pressure), and/or a digitizer for detecting a magnetic-type stylus pen.

The audio modules 103 and 114 may include a microphone hole and a speaker hole. The microphone hole may have a microphone disposed therein to acquire external sound, and may have a plurality of microphones disposed to sense a sound direction. The speaker hole and the microphone hole may be implemented with one hole 103, or the speaker (e.g., a piezo speaker) may be included without the speaker hole. The speaker hole may include the external speaker hole and the communication receiver hole 114.

The electronic device 100 includes a sensor module to generate an electrical signal or data value corresponding to an internal operational state or an external environmental state. The sensor module may further include a proximity sensor disposed adjacent to the first face 110A of the housing 110, a fingerprint sensor disposed integrally or adjacent to the display 101, and or a biometric sensor (e.g., a heart rate monitoring (HRM) sensor) disposed to the second face 110B of the housing 110. The electronic device 100 may further include at least one of senor modules a gesture sensor, a gyro sensor, an atmospheric pressure sensor, a magnetic sensor, an acceleration sensor, a grip sensor, a color sensor, an IR sensor, a biometric sensor, a temperature sensor, a humidity sensor, and an illuminance sensor.

The camera modules 105, 112, 113, and 106 may include the first camera device 105 disposed to the first face 110A of the electronic device 100, the second camera device 112 disposed to the second face 110B, and/or the flash 113. The camera devices 105, 112, and 113 may include one or more lenses, an image sensor, and/or an image signal processor.

The flash 106 may include an LED or a xenon lamp. Two or more lenses (wide angle and telephoto lenses) and image sensors may be disposed to one face of the electronic device 100.

The key input device 117 may be disposed to the side face 110C of the housing 110. Alternatively, the electronic device 100 may not include the entirety or part of the aforementioned key input device 117, in which case the key input device 117 may be implemented on the display 101 in a different form such as a soft key. The key input device may include at least part of the fingerprint sensor 116 disposed to the second face 110B of the housing 110.

The connector hole 108 may accommodate a connector for transmitting/receiving power and/or data of an external electronic device and/or a connector for transmitting/receiving an audio signal with respect to the external electronic device. For example, the connector hole 108 may include a universal serial bus (USB) connector or an earphone jack.

Figure 3:
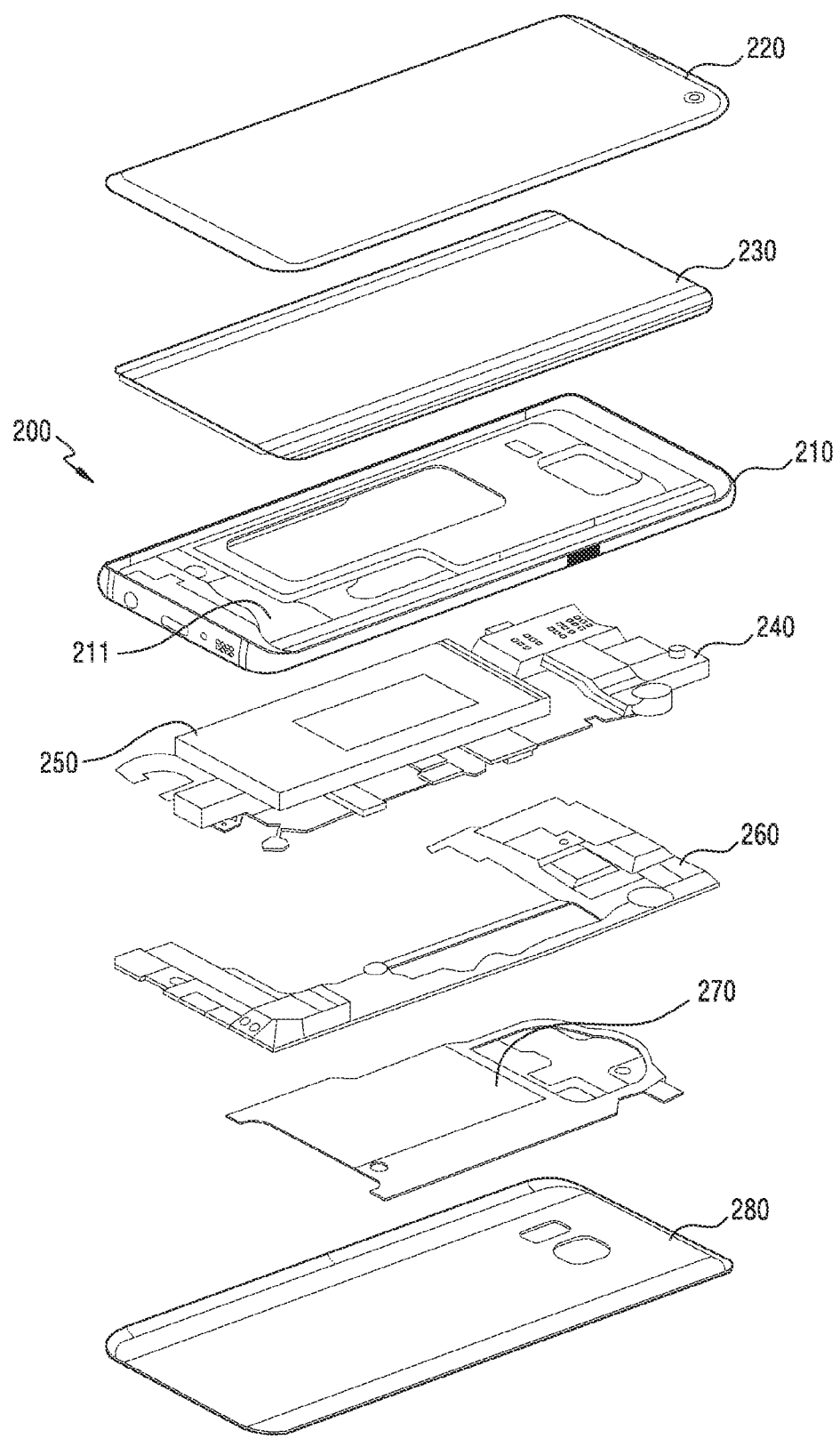
FIG. 3 is an exploded perspective view of an electronic device according to an embodiment.

FIG. 3 is an exploded perspective view of an electronic device according to an embodiment. Referring to FIG. 3, an electronic device 200 may include a lateral bezel structure 210, a first support member 211 (e.g., a bracket), a front plate 220, a display 230, a PCB 240, a battery 250, a second support member 260 (e.g., a rear case), an antenna 270, and a rear plate 280. The electronic device 200 may omit at least one of these components, or may additionally include other components. At least one of the components of the electronic device 200 may be the same as or similar to at least one of the components of the electronic device 100 of FIG. 1 or FIG. 2, and therefore, redundant descriptions will be omitted hereinafter.

The first support member 211 may be coupled with the lateral bezel structure 210 by being disposed inside the electronic device 200, or may be constructed integrally with respect to the lateral bezel structure 210. The first support member 211 may be constructed of a metal material and/or non-metal material (e.g., polymer). The display 230 may be bonded to one face of the first support member 211, and the PCB 240 may be bonded to the other face thereof. A processor, a memory, and/or an interface may be mounted on the PCB 240. The processor may include one or more of a central processing unit, an application processor, a graphic processing unit, an image signal processor, a sensor hub processor, and a communication processor.

The memory may include a volatile memory or a non-volatile memory.

The interface may include a high definition multimedia interface (HDMI), a USB interface, a secure digital (SD) card interface, and/or an audio interface. For example, the interface may electrically or physically couple the electronic device 200 and the external electronic device, and may include a USB connector, an SD card/multimedia card (MMC) connector, or an audio connector.

As a device for supplying power to at least one component of the electronic device 200, the battery 250 may include a non-rechargeable primary cell, a rechargeable secondary cell, or a fuel cell. At least a part of the battery 250 may be disposed on the same plane substantially with respect to the PCB 240. The battery 250 may be disposed integrally inside the electronic device 200, or may be detachably disposed with respect to the electronic device 200.

The antenna 270 may be disposed between the rear plate 280 and the battery 250 and may include a near field communication (NFC) antenna, a wireless charging antenna, and/or a magnetic secure transmission (MST) antenna. The antenna 270 may perform NFC with the external electronic device or may wirelessly transmit/receive power required for charging. An antenna structure may be constructed by at least a part of the lateral bezel structure 210 and/or the first support member 211 or a combination thereof.

Figure 4:
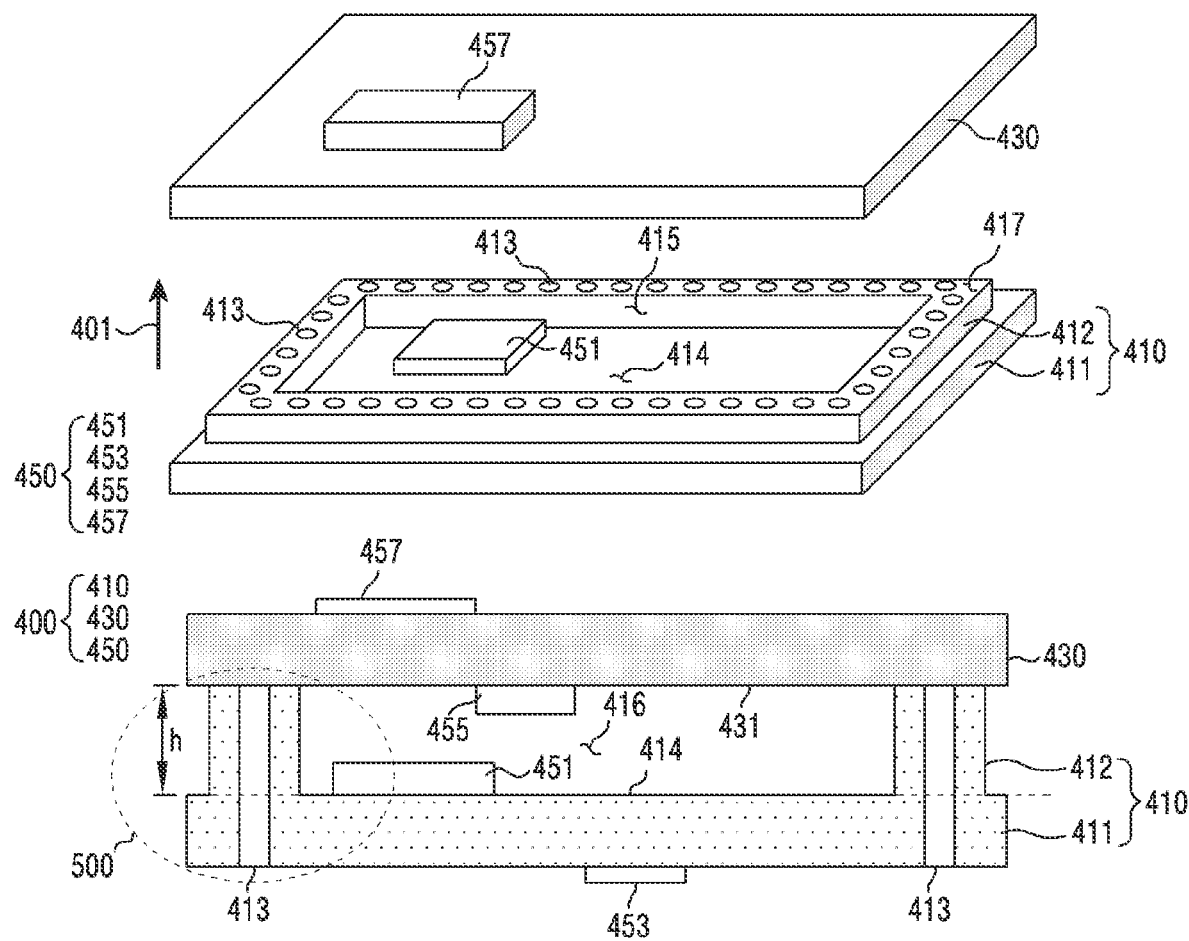
FIG. 4 illustrates an exploded view and cross-sectional view of a PCB module according to an embodiment.

FIG. 4 illustrates an exploded view and cross-sectional view of a PCB 400 according to an embodiment.

Referring to FIG. 4, the PCB 400 may include a sub PCB 410, a main PCB 430, and at least one electronic component 450 mounted or located on the sub PCB 410 and/or main PCB 430. The sub PCB 410 and the main PCB 430 may respectively correspond to a first PCB and a second PCB. Hereinafter, an upper face faces an arrow direction 401, and a lower face faces a direction opposite to the arrow direction 401. A side face faces a direction perpendicular to the arrow direction 401.

The sub PCB 410 may define a cavity 416 by including a base PCB 411 and a sidewall 412 extending from an upper face 414 of the base PCB 411. Conductive vias 413 may be formed inside the sub PCB 410.

The base PCB 411 may include a plurality of layers having a conductive layer and/or a non-conductive layer. The base PCB 411 may include a circuit pattern printed on a surface thereof or an inner portion thereof. The base PCB 411 may further include a solder resist layer coated on the surface thereof.

The sidewall 412 may extend from the upper face 414 of the base PCB 411 to a lower face 431 of the main PCB 430. The sidewall 412 may be constructed to have a height (e.g., b) along a periphery region of the base PCB 411 Herein, the periphery region may refer to an edge of the base PCB 411, or may refer to an inner region adjacent to the edge. For example, the sidewall 412 may be disposed on the edge or an outer boundary of the base PCB 411, or spaced apart from the inside of the edge. The height h of the sidewall 412 may be greater than a height of at least one electronic component 451 mounted or located on the upper face 414 of the base PCB 411 or at least one electronic component 455 mounted or located on the lower face 431 of the main PCB 430. In FIG. 4, a PCB module has a rectangular shape, and the sidewall 412 has a shape corresponding to the PCB module. However, a shape of the PCB module 400 is not limited to the illustrated example.

The sub PCB 410 may include the cavity 416 corresponding to a space surrounded by an inner face 415 of the sidewall 412. The upper face 414 of the base PCB 411 may be exposed toward the cavity 416 of the sub PCB 410. The cavity 416 of the sub PCB 410 may correspond to a closed space surrounded by the upper face 414 of the base PCB 411, the inner face 415 of the sidewall 412, and the lower face 431 of the main PCB 430. The sidewall 412 may include a plurality of layers, and each of the layers constituting the sidewall 412 may include an opening corresponding to the cavity 416.

The main PCB 430 may face the sub PCB 410 and may be disposed spaced apart from the base PCB 411 of the sub PCB 410. The main PCB 430 may be surface-mounted or located on an upper face 417 of the sidewall 412 of the sub PCB 410 and may be spaced apart by the height h of the sidewall 412 from the base PCB 411. Alternatively, the sidewall 412 of the sub PCB 410 may be surface-mounted or located on the lower face 431 of the main PCB 430. The lower face 431 of the main PCB 430 may be partially exposed toward the cavity 416 of the sub PCB 410. The main PCB 430 may be bonded to a conductive member included in the upper face 417 through a solder.

The PCB module 400 may include at least one or more electronic components 451, 453, 455, and 457 mounted or located on a surface of the sub PCB 410 and main PCB 430. The at least one or more electronic components 451 and 455 may be mounted or located on a surface exposed toward the cavity 416 in the sub PCB 410 and main PCB 430. For example, the at least one or more electronic components 451 and 455 may be mounted or located on the upper face 414 of the base PCB 411 and/or the lower face 431 of the main PCB 430.

The base PCB 411 and/or the sidewall 412 may include the plurality of conductive vias 413 disposed along the sidewall 412 of the sub PCB 410. Although it is illustrated in FIG. 4 that the conductive vias 413 are disposed in one row along the sidewall, the conductive vias 413 may alternatively be disposed in two or more rows.

The sub PCB 410 may include the conductive vias 413 disposed inside the sidewall 412. The conductive vias 413 may penetrate all of layers constituting the sidewall 412. The conductive vias 413 may penetrate some (e.g., through-holes of an inner layer) or all (e.g., through-holes of all layers) of the layers constituting the base PCB 411. Among the conductive vias 413, a first conductive via may penetrate the entirety of the base PCB 411, and a second conductive via may penetrate part of the base PCB 411. The conductive vias 413 penetrate the sub PCB 410 (e.g., the base PCB 411 and the sidewall 412), but without being limited thereto, the conductive vias 413 may also penetrate the entirety or part of the main PCB 430.

The conductive vias 413 may electrically couple the electronic components 451 and 453 mounted or located on the sub PCB 410 and the electronic components 455 and 457 mounted or located on the main PCB 430. One side of the conductive vias 413 may be coupled with a conductive member (e.g., the fourth layer 514 of FIG. 5) included in the upper face 417 of the sidewall 412, and the conductive member may be coupled with a conductive pattern of the main PCB 430. The other side of the conductive vias 413 may be coupled with a conductive pattern coupled with the electronic components 451 and 453 mounted or located on the base PCB 411.

The sidewall 412 of the sub PCB 410 may function as an interposer which electrically couples the base PCB 411 and the main PCB 430. The electronic component (e.g., 451, 455) may be compactly mounted or located inside the electronic device by securing an inner space through the interposer while disposing the main PCB 430 on the sub PCB 410. Herein, an area occupied by the PCB module in the electronic device can be decreased, and an area for mounting a battery can be increased.

Figure 5:
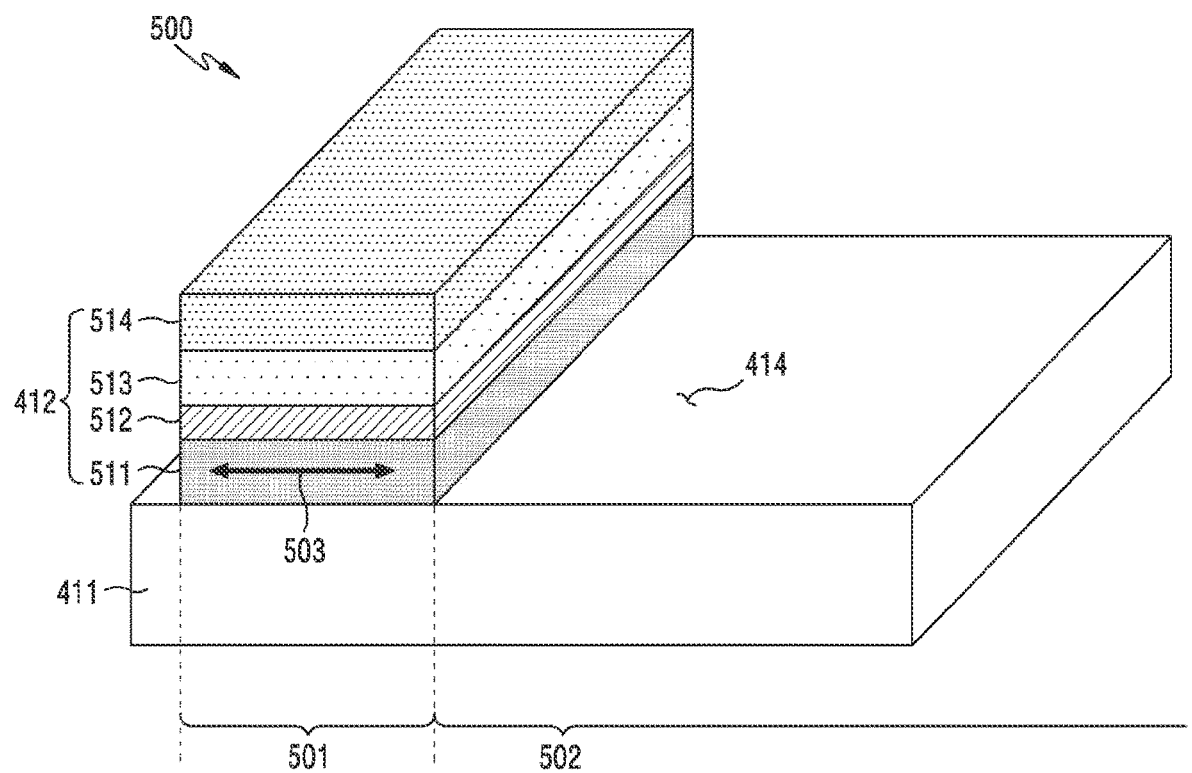
FIG. 5 illustrates a plurality of layers constituting a sidewall of a first PCB according to an embodiment.

FIG. 5 illustrates a plurality of layers constituting the sidewall 412 of the first PCB 410 of FIG. 4 according to an embodiment. FIG. 5 may correspond to some regions 500 of the sub PCB 410.

Referring to FIG. 5, the sidewall 412 may include a plurality of layers 511, 512, 513, and 514 including a conductive layer and/or a non-conductive layer.

The sidewall 412 may include the first layer 511 laminated on the upper face 414 of the base PCB 411, the second layer 512 disposed on the first layer 511, the third layer 513 disposed on the second layer 512, and the fourth layer 514 disposed on the third layer 513.

Although the sidewall is constructed of four layers in the example of FIG. 5, without being limited thereto, at least one layer may be further included between the respective layers in another embodiment. In addition, each of the layers constituting the sidewall may have a different height. Although the base PCB 411 is indicated as a single layer in the example of FIG. 5 for convenience of explanation, the base PCB 411 may include two or more layers.

The first layer 511 may be laminated on the base PCB 411 of the sub PCB 410, and may be constructed of an insulating material. The first layer 511 may be constructed of a low-flow prepreg (pre-impregnated with resin), which refers to a prepreg having a lower resin flowability than a regular prepreg (or a regular flow prepreg). Since a resin contained in the prepreg is partially cured during a PCB manufacturing process, a resin flow may occur in a direction of an arrow 503 in a PCB compressing process. For example, when pressure is applied on a prepreg layer having a specific height and width, a resin may flow out in a direction in which pressure is low, and thus the prepreg layer may decrease in height and increase in width. The resin of the prepreg may include an epoxy and a filler. A prepreg having a low flowability may be implemented by changing a composition of the epoxy or filler or by changing a ratio of the filler to the epoxy.

Since the first layer 511 is constructed of a low-flow prepreg, a shape of the first layer 511 may be maintained in a process of manufacturing the PCB module 400. For example, when the base PCB 411 includes a first region 501 and a second region 502, the first layer 511 may be located only in the first region 501. Even if pressure is applied on the first layer 511 constructed of the low-flow prepreg, a state of being located in the first region 501 may be maintained since a resin flow is low in a direction of the arrow 503.

The first layer 511 may be configured to form an air gap between the base PCB 411 and the second layer 512. Since an opening of the first layer 511 is covered by the second layer 512, an air gap (e.g., an air gap 702 of FIG. 7B) surrounded by the base PCB 411, an inner face of the first layer 511, and the second layer 512 may be formed. When the first layer 511 is constructed of a low-flow prepreg, a height of the first layer 511 may maintain a specific level even if other layers are laminated on the first layer 511. Referring to FIG. 7B, since the first layer 511 is constructed of the low-flow prepreg, a height h of the air gap formed between the base PCB 411 and the second layer 512 may maintain a specific level.

It is sufficient that the first layer 511 is constructed of a material capable of forming the air gap during the PCB manufacturing process, and it is not necessarily constructed of the low-flow prepreg. For example, even if pressure or heat is applied, it may be sufficient that the first layer 511 is constructed of a material having a characteristic capable of maintaining a volume of an opening formed therein.

The second layer 512 may include a non-conductive layer constructed of a polyimide.

The second layer 512 may be configured to protect a circuit pattern located on the base PCB 411. For example, the second layer 512 may include a circuit pattern exposed to the upper face 414 of the base PCB 411 in a process of forming the cavity 416 of FIG. 4 of the sub PCB 410. To form the cavity 416 of the sub PCB 410, some regions of layers disposed on the first layer 511 may be removed by using a laser. When the laser reaches the upper face 414 of the base PCB 411 exposed to an opening 511b (FIG. 7A) of the first layer 511, a circuit pattern printed on a surface of the base PCB 411 may be damaged. The second layer 512 may prevent the laser from penetrating the second layer 512 to reach the upper face 414 of the base PCB 411, thereby protecting the circuit pattern of the base PCB 411.

The second layer 512 may further include a conductive member that may be electrically disconnected from conductive vias 413 of the sub PCB 410. For example, the conductive member of the second layer 512 may be patterned to be spaced apart from the conductive vias 413 of the sub PCB 410.

The second layer 512 may be a single-sided flexible copper clad laminate (FCCL) including a polyimide layer and a copper foil laminated on the polyimide layer.

The second layer 512 may be constructed of a material having a rigidity of a specific level in an environment (e.g., high temperature) in which the sub PCB 410 is manufactured. That is, the second layer 512 may be constructed of a material which is not softened at high temperature. The second layer 512 may include a material which has been pre-cured when being laminated on the first layer 511. For example, the second layer 512 may include a synthetic resin, a polyimide, or a metal thin film.

The third layer 513 may be constructed of an insulating material. The third layer 513 may be constructed of a regular prepreg having a higher flowability than the first layer 511. The third layer 513 may function as an adhesive means between the second layer 512 and the fourth layer 514.

The fourth layer 514 may include a conductive member that may be coupled to the conductive vias 413. The fourth layer 514 may further include a non-conductive layer disposed below the conductive member and disposed on the third layer 513, and the conductive member may be disposed on the non-conductive layer. The non-conductive layer of the fourth layer 514 may be constructed of a prepreg. The fourth layer 514 may be a single-sided copper clad laminate (CCL) including a conductive layer and a prepreg layer. The fourth layer 514 may include a solder resist layer coated on the conductive member.

The height h of the sidewall 412 constructed of the first layer 511 to the fourth layer 514 is determined such that an electronic component is mounted or located in an inner space surrounded by the sidewall 412. For example, referring to FIG. 4, the height h of the sidewall 412 may be determined such that the electronic component 451 mounted or located on the upper face 414 of the base PCB 411 and/or the electronic component 455 mounted or located on the lower face 431 of the main PCB 430 are not interfered with or electrically affected by each other (e.g., performance does not deteriorate due to noise or heating).

The sidewall 412 may include a conductive member disposed to an outer face. For example, the outer face of the sidewall 412 may be plated with a conductive member. The conductive member may shield an electromagnetic wave irradiated toward an inner space or a conductive via, thereby decreasing a performance degradation of an electronic component in the PCB. The conductive member may include a conductive material such as gold, copper, lead, or silver for electromagnetic shielding.

Figure 6A:
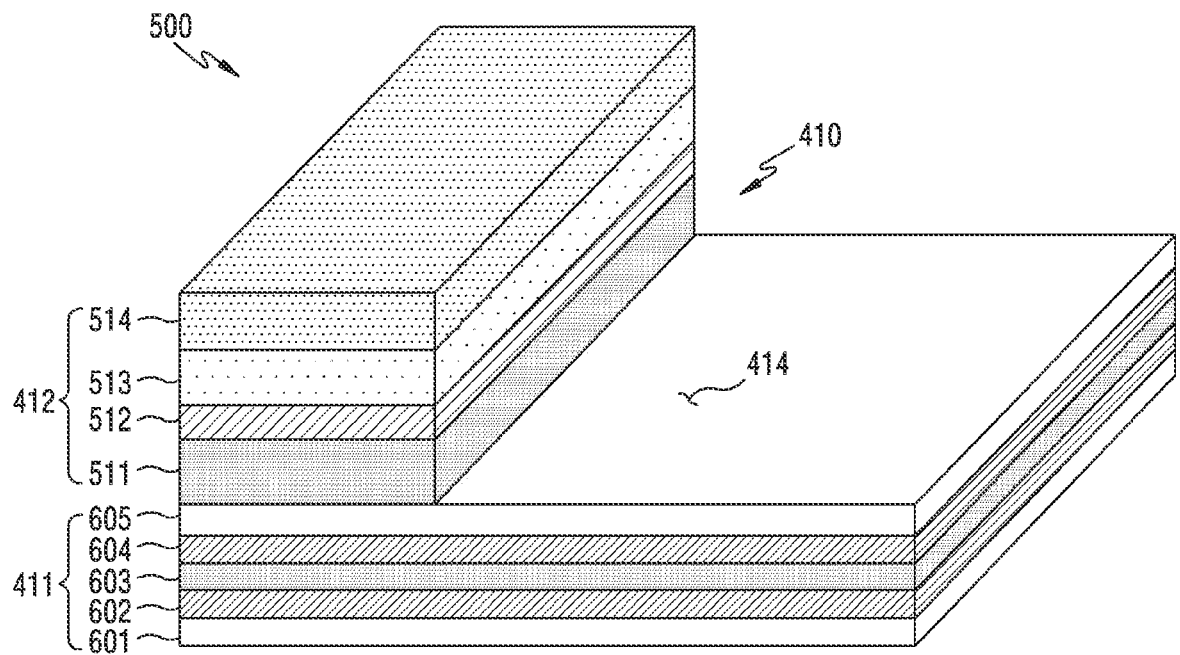
FIG. 6A illustrates a plurality of layers constituting a base PCB according to a first embodiment.
Figure 6B:
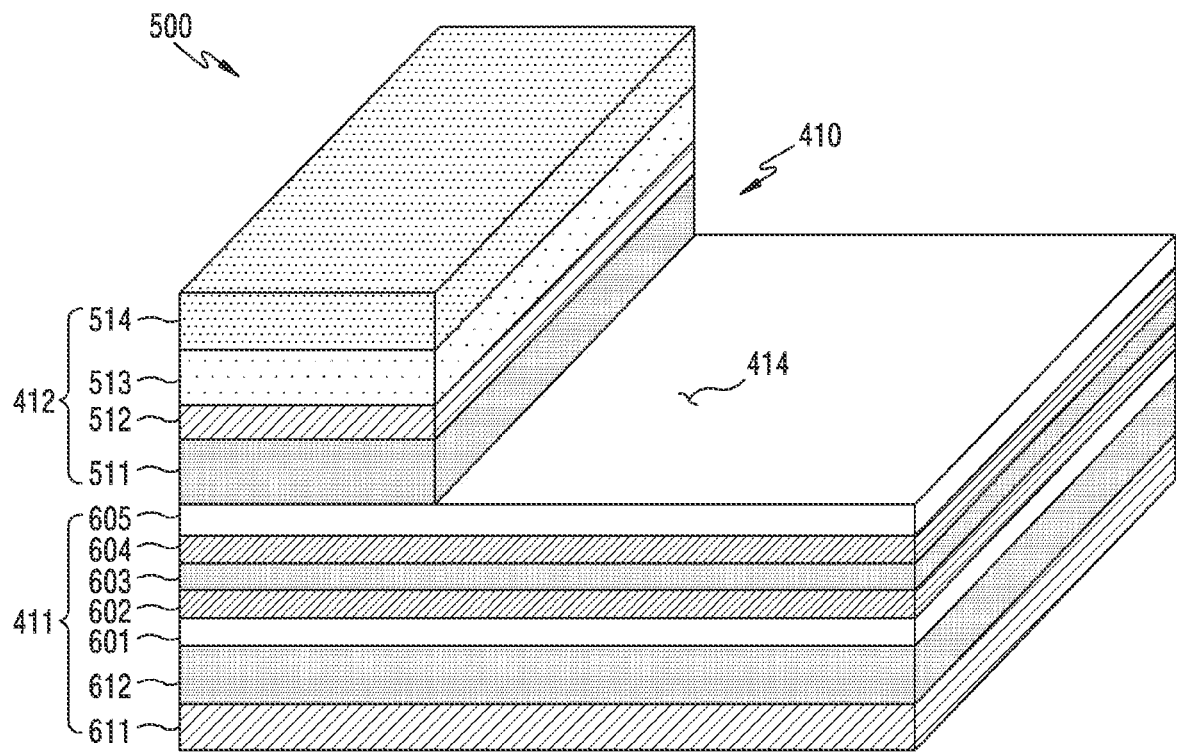
FIG. 6B illustrates a plurality of layers constituting a base PCB according to a second embodiment.

FIG. 6A and FIG. 6B illustrate a plurality of layers constituting the base PCB 411 according to first and second embodiments. Referring to FIG. 6A, in the first embodiment, the base PCB 411 may include a first layer 601, a second layer 602 located on the first layer 601, a third layer 603 located on the second layer 602, a fourth layer 604 located on the third layer 603, and a fifth layer 605 located on the fourth layer 604. Referring to FIG. 6B, in the second embodiment, the base PCB 411 may further include a sixth layer 612 located below the first layer 601 and a seventh layer 611 located below the sixth layer 612.

In FIG. 6A and FIG. 6B, for convenience of explanation, the base PCB 411 is constructed of 5 (e.g., FIG. 6A) or 7 (e.g., FIG. 6B) layers, but the number of layers constituting the base PCB 411 is not limited thereto. That is, the number of layers constituting the base PCB 411 may be greater or less than 5 or 7.

In FIG. 6A and FIG. 6B, for convenience of explanation, each of layers (e.g., the first layer 601 to the seventh layer 611) constituting the base PCB 411 is indicated as a single layer, but each of the layers may include two or more layers. For example, the first layer 601 may include a non-conductive layer constructed of a prepreg and a conductive layer constructed of copper. The seventh layer 611 of FIG. 6B may include a single-sided FCCL constructed of a polyimide and a copper foil.

The plurality of layers constituting the base PCB 411 may include a conductive layer and/or a non-conductive layer. The non-conductive layer may be a prepreg. The conductive layer may be a layer constructed of copper. The conductive layer may include a conductive pattern that may be constructed to be coupled with the conductive vias 413. The conductive pattern included in the conductive layer may function as a conductive path between an electronic component 451 and 453 mounted or located on the base PCB 411 and the conductive vias 413. The conductive layer and the non-conductive layer may be sequentially laminated to construct the base PCB 411. For example, a first conductive layer, a first non-conductive layer, a second conducive layer, and a second non-conductive layer may be sequentially laminated to construct the base PCB 411.

If the layers constituting the base PCB 411 have different attributes such as a material or a thickness, warpage may occur in the base PCB 411. For example, when the base PCB 411 is constructed of the second layer 602, the third layer 603, and the fourth layer 604 and when the second layer 602 and the fourth layer 604 are constructed of different materials, each layer may be deformed (e.g., expanded or contracted) in a different level even if the second layer 602 and the fourth layer 604 are exposed in the same environment (e.g., the same temperature). In this case, warpage may occur in the base PCB 411 constructed of the second layer 602 to the fourth layer 604. Some or all of the plurality of layers constituting the base PCB may be symmetrically configured to minimize the deformation (or warpage) of the base PCB.

The plurality of layers of the base PCB 411 may include layers located symmetrical with respect to a center layer.

The center layer may refer to a criterion for symmetry, and when it is said that two layers are symmetrical with respect to the center layer, it may imply that the two layers have the same thickness and/or the same material. An n-th layer above the center layer may have the same characteristic (e.g., thickness or material) as an n-th layer below the center layer.

In FIG. 6A, since the first layer 601 and the second layer 602 are symmetrical to the fifth layer 605 and the fourth layer 604, respectively, with respect to the third layer 603, the third layer 603 is the center layer. The fourth layer 604 which is a first layer above the third layer 604 may be constructed to have the same thickness and/or the same material as the second layer 602 which is a first layer below the third layer 603. In addition, the fifth layer 506 which is a second layer above the third layer 603 may be constructed to have the same thickness and/or the same material as the first layer 601 which is a second layer below the third layer 603.

The base PCB 411 may include a layer which is symmetrical to some or all of layers constituting the sidewall 412 with respect to the center layer. Referring to FIG. 6B, the base PCB 411 may include layers symmetrical to some of the layers constituting the sidewall 412 with respect to the third layer 603 (i.e., the center layer). For convenience of explanation, the first layer 511 of the sidewall 412 is referred to as an air gap forming layer, and the second layer 512 is referred to as a protective layer.

The base PCB 411 may include the seventh layer 612 which is symmetrical to the air gap forming layer 511 of the sidewall 412 with respect to the third layer 603. The seventh layer 612 may be disposed at a location symmetrical to the air gap forming layer 511 with respect to the third layer 603. The base PCB 411 may further include the sixth layer 611 which is symmetrical to the protective layer 512 of the sidewall 412 with respect to the third layer 603. The sixth layer 611 may be disposed at a location symmetrical to the protective layer 512 with respect to the third layer 603. Although FIG. 6B illustrates the base PCB 411 including the layers 611 and 612 symmetrical to the two layers 511 and 512 among the layers constituting the sidewall 412, layers symmetrical to the remaining layers (e.g., the third layer 513 of fourth layer 514 of the sidewall 412) among the layers constituting the sidewall 412 may also be included in the base PCB 411 in another embodiment.

That is, the sixth layer 611 and seventh layer 612 symmetrical to the layer of the sidewall 412 in the base PCB 411 may not include an opening. The air gap forming layer 511 and the protective layer 512 which constitute the sidewall 412 include an opening corresponding to the cavity 416 of the sub PCB 410, but the sixth layer 611 and the seventh layer 612 which are symmetrical to the air gap forming layer 511 and the protective layer 512 with respect to the third layer 603 may not include the opening.

FIGS. 7A, 7B, 7C and 7D illustrate the first, second, third and fourth steps of a manufacturing process of forming the sidewall 412 of FIG. 6A and FIG. 6B of the sub PCB 410 of FIG. 6A and FIG. 6B according to an embodiment.

Figure 7A:
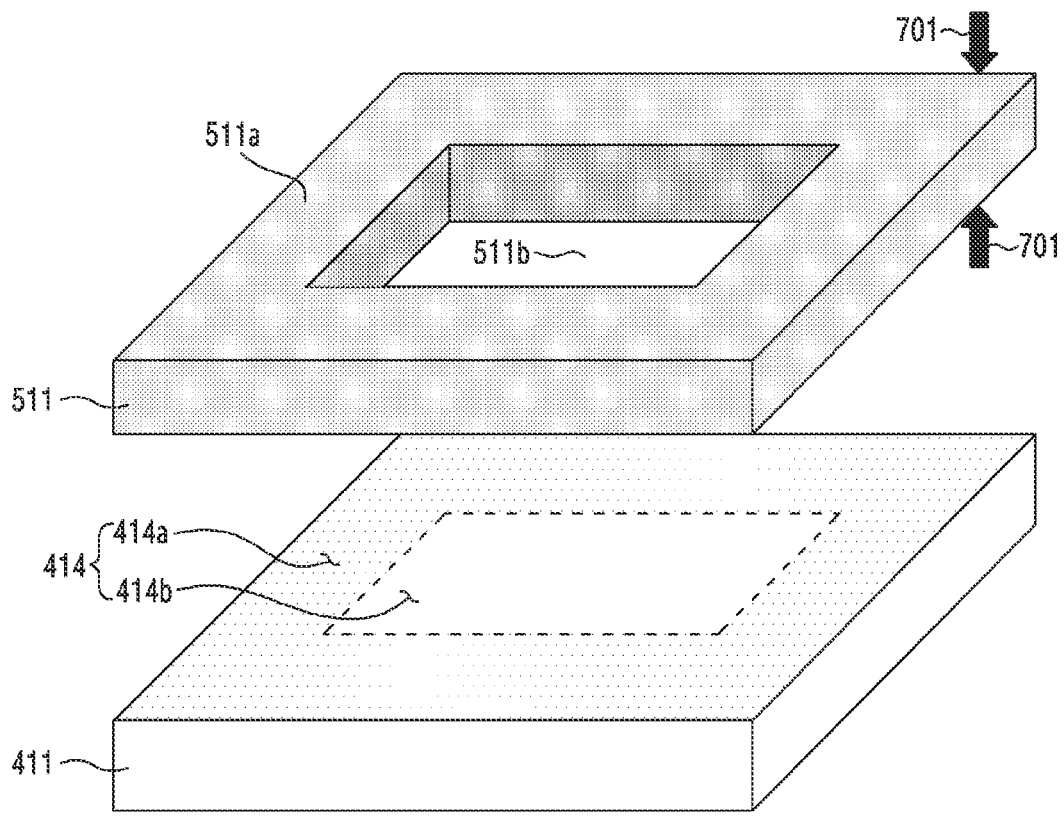
FIG. 7A illustrates a first step of a manufacturing process of forming a sidewall of the first PCB according to an embodiment.
Figure 7B:
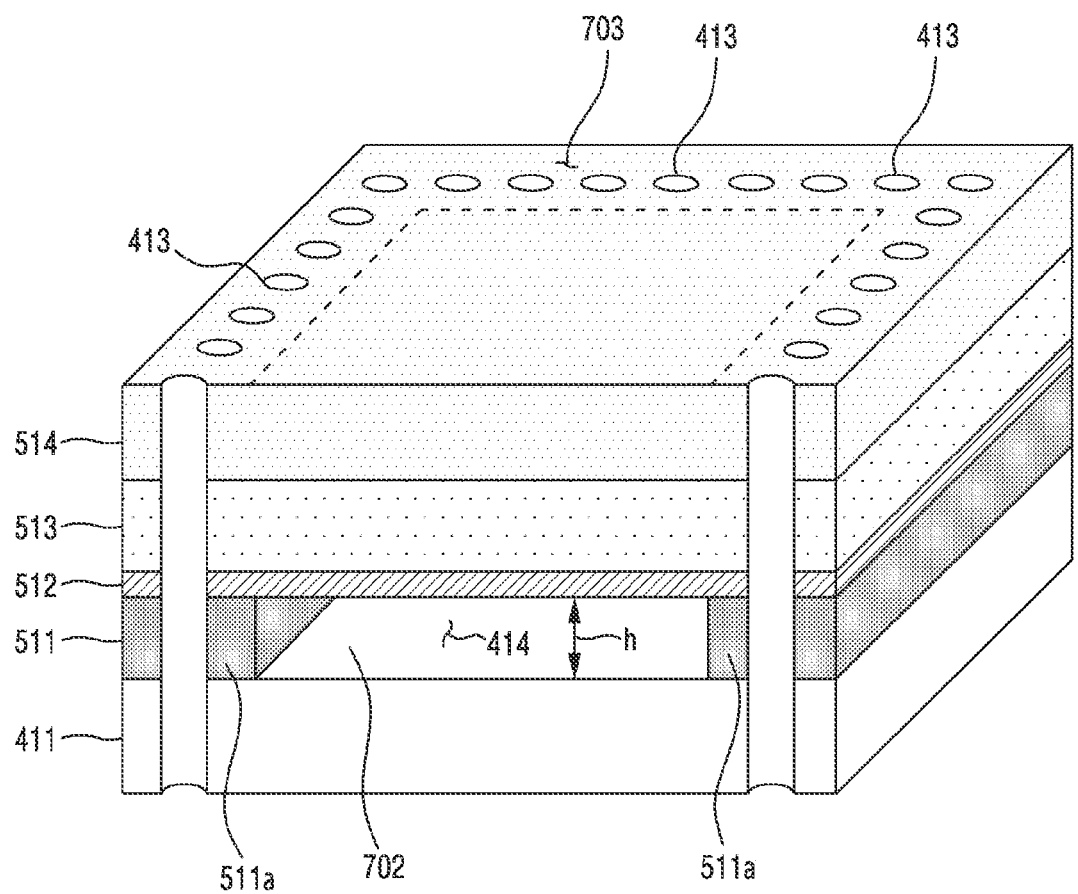
FIG. 7B illustrates a second step of a manufacturing process of forming a sidewall of the first PCB according to an embodiment.
Figure 7C:
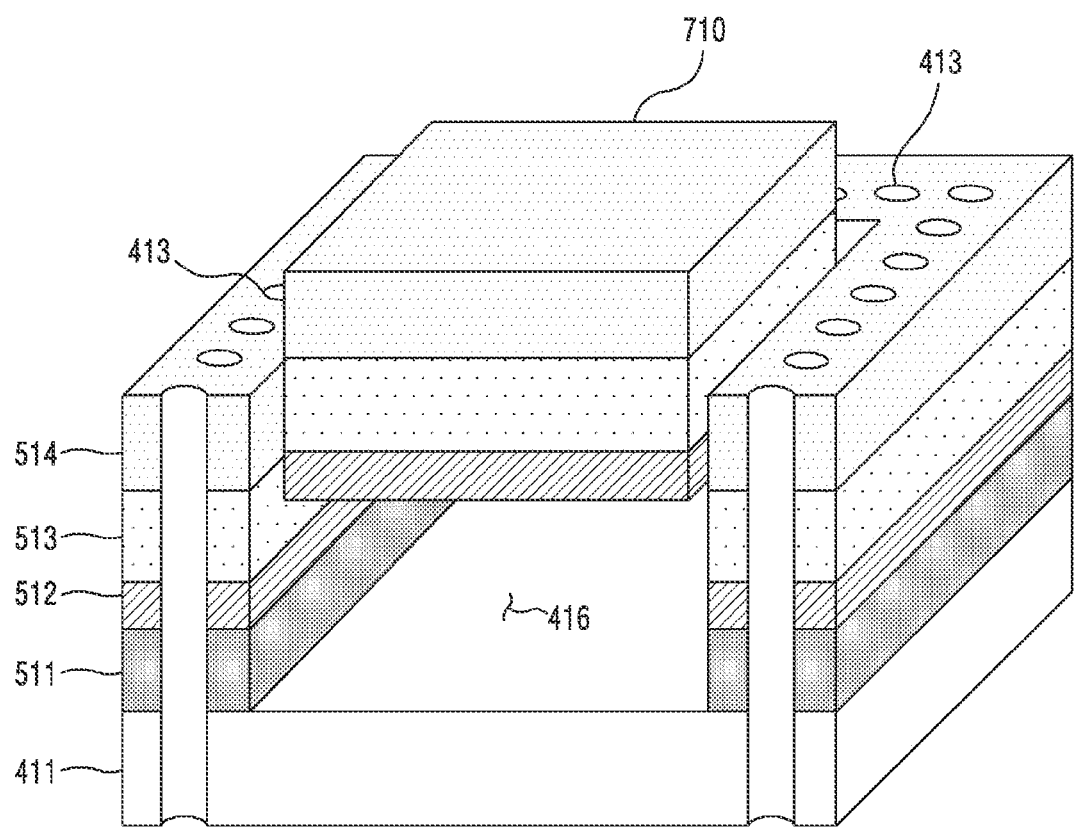
FIG. 7C illustrates a third step of a manufacturing process of forming a sidewall of the first PCB according to an embodiment.
Figure 7D:
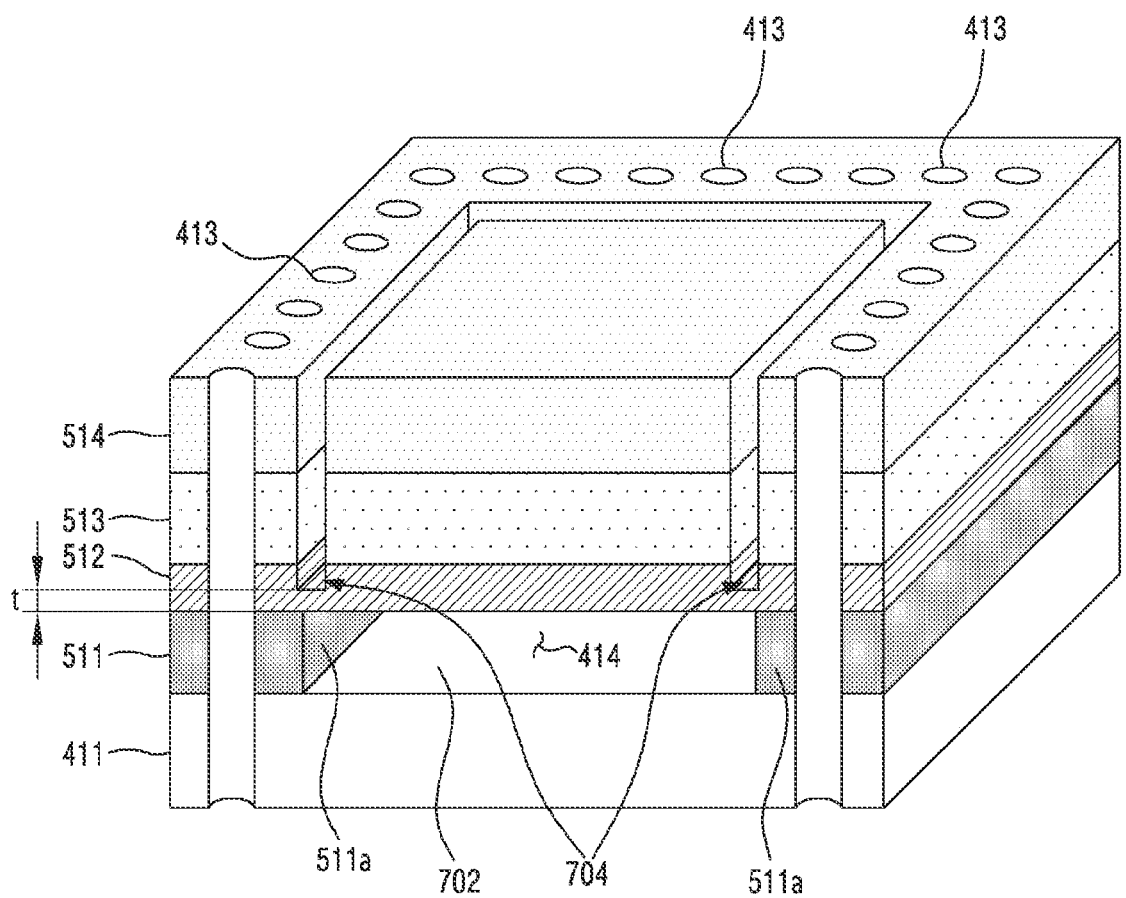
FIG. 7D illustrates a fourth step of a manufacturing process of forming a sidewall of the first PCB according to an embodiment.

Specifically, FIGS. 7B, 7C and FIG. 7D illustrate a cross-section including an air gap 702 of the sub PCB 410 in each step of the manufacturing process for convenience of explanation. Although it is described hereinafter that a layer constituting a sidewall is constructed of the first layer 511 to the fourth layer 514, the sidewall may further include at least one layer disposed between the layers in another embodiment. For example, the manufacturing process may further include a step in which an additional layer is laminated on the third layer 513 before the fourth layer 514 is laminated.

The manufacturing process of the sub PCB 410 described herein is limited to laminating of a layer, and additional steps may be added between the respective steps.

A manufacturing process of forming the sidewall 412 of FIG. 6A and FIG. 6B of the sub PCB 410 of FIG. 6A and FIG. 6B may include a first step in which the first layer 511 is laminated in some regions of the base PCB 411, a second step in which layers are laminated on the first layer 511, and a third step in which layers located on the first layer 511 are processed to form the cavity 416 of FIG. 4.

Referring to FIG. 7A, in the first step, the first layer 511 may be located on the base PCB 411. The first layer 511 may include a periphery portion 511a constructed of an insulating material and an opening 511b surrounded by the periphery portion 511a. The periphery portion 511a of the first layer 511 may be disposed on a first region 414a corresponding to a periphery region in an upper face of the base PCB 411, and the opening 511b of the first layer 511 may be disposed on a second region 414b corresponding to an inner region of the base PCB 411. For example, the first layer 511 may be formed in a shape including the opening 511b and may be located on the base PCB 411. The periphery portion 511a of the first layer 511 may constitute part of a sidewall 412 of a first PCB 410, and the opening portion 511b of the first layer 511 may constitute part of a cavity 416 of the first PCB 410.

A space (corresponding to the opening 511b of the first layer) surrounded by the upper face 414 of the base PCB 411 and the periphery portion 511a of the first layer 511 may be formed after the first layer 511 is located. If the first layer 511 is a low-flow prepreg layer, a shape of the space may be maintained even if pressure is applied to the first layer 511 after the first step. That is, since the first layer 511 is formed with the low-flow prepreg, even if pressure is applied to the first layer 511 in an arrow direction 701, a prepreg constituting the periphery portion 511a can be prevented from flowing into the second region 414b.

Referring to FIG. 7B, in the second step, the second layer 512 to the fourth layer 514 may be sequentially located on the first layer 511.

The second layer 512 may be laminated on the first layer 511 in such a manner that a periphery region of the lower face of the second layer 512 (e.g., a portion corresponding to the periphery portion 511a of FIG. 7A of the first layer 511) is in contact with the periphery portion 511a of the first layer 511, and a region surrounded by the periphery region of the lower face of the second layer 512 (e.g., a portion corresponding to the opening 511b of FIG. 7A of the first layer 511) is exposed to the air of the opening 511b of the first layer 511. After the second layer 512 is located on the first layer 511, the air gap 702 surrounded by the base PCB 411, the periphery portion 511a of the first layer 511, and the second layer 512 may be formed. For example, an air layer may be present between the second layer 512 and the base PCB 411. The air gap 702 may correspond to the opening 511b of the first layer 511.

The second layer 512 may be constructed of a material having a rigidity of a specific level in an environment in which the PCB is manufactured. That is, the second layer 512 may be constructed of a material which is not softened at high temperature. For example, the second layer 512 may include a polyimide layer which has already been cured or a single-sided FCCL.

When the second layer 512 is constructed of a material having a rigidity of a specific level, it is possible to minimize occurrence of an inner region of the second layer 512 being sagged toward the opening 511b of the first layer 511. For example, since the second layer 512 is laminated on the first layer 511 in a state of having a rigidity of a specific level, the air gap 702 between the base PCB 411 and the second layer 512 can be prevented from narrowing or disappearing.

The third layer 513 and the fourth layer 514 may be located sequentially on the second layer 512. Since the second layer 512 has been pre-cured, even if the third layer 513 and the fourth layer 514 are laminated on the second layer 512, it is possible to minimize that layers disposed on the opening 511b of the first layer 511 are sagged toward the opening 511b. In other words, even if other layers are additionally laminated on the second layer 512, the air gap 702 between the base PCB 411 and the second layer 512 can be maintained.

The conductive vias 413 may be constructed before the cavity is processed. The conductive vias 413 may be constructed along a region 703 corresponding to the periphery portion 511a of the first layer. The conductive vias 413 may be constructed to penetrate some or all of layers (e.g., the plurality of layers 601, 602, 603, 604, and 605) constituting the base PCB 411 and layers (e.g., the plurality of layers 511, 512, 513, and 514) constituting the sidewall 412. In another embodiment, the conductive vias 413 may be constructed not to penetrate layers 601, 602, 603, 604, and 605 constituting the base PCB 411 but to penetrate some or all of layers 511, 512, 513, and 514 constituting the sidewall 412.

Referring to FIG. 7C, in the third step, an inner region of layers disposed on the opening 511b of FIG. 7A of the first layer 511 may be removed by using a laser drill. That is, a portion (hereinafter, a 'cavity part 710') corresponding to the cavity 416 of FIG. 4 of the sub PCB 410 may be removed from the second layer 512 to the fourth layer 514.

After the second step is performed, each of the second layer 512 to the fourth layer 514 may include a portion (hereinafter, a 'sidewall part') corresponding to the sidewall 412 of the sub PCB 410 and the cavity parts 710. In the third step, the cavity parts 710 of the second layer 512 to fourth layer 514 may be removed by using a drill, and only the sidewall parts may remain. When the cavity parts 710 (e.g., a region corresponding to the cavity 416 of FIG. 4) of the second layer 512 to fourth layer 514 are removed, the cavity 416 surrounded by the remaining sidewall parts (e.g., a portion corresponding to the periphery portion 511a of the first layer 511 among the second layer 512 to the fourth layer 514) and the periphery portion 511a of the first layer 511 may be formed. The periphery portion 511a of FIG. 7A of the first layer 511 and the sidewall parts of the second layer 512 to fourth layer 514 may correspond to a sidewall 412 of a first PCB 410.

A drill process preferably uses a laser, but it is sufficient to use a means capable of removing the cavity parts 710 from the second layer 512 to the fourth layer 514. A laser drill process may be performed by using at least any one of carbon dioxide (CO2), yttrium aluminium garnet (YAG), and Eximer.

Referring to FIG. 7D, a processing depth for processing the cavity may be adjusted not to penetrate the second layer 512, thereby protecting a circuit pattern on the base PCB 411 from a laser. A laser device may adjust intensity or the number of times the laser is radiated to control such that the laser does not penetrate the second layer 512. As a result, a groove 704 may be formed on the second layer. For example, if the second layer 512 is a single-sided FCCL including a copper foil only on an upper face of the second layer 512, the laser may be adjusted to penetrate the copper foil of the single-sided FCCL and not to penetrate a polyimide layer. That is, a depth of the groove 704 formed on the second layer 512 may be less than a height of the second layer 512, and may be greater than a height of the copper foil of the second layer 512. When the laser is adjusted not to penetrate the second layer 512, a part of a cavity 416 of layers disposed on the first layer 511 may be coupled with a sidewall 412 of a first PCB 410. Since a thickness t of a portion which couples the part of the cavity 416 and the part of the sidewall 412 of the second layer 512 has become thinner by a drill process, the part of the cavity 416 of layers disposed on the first layer 511 can be easily removed from the sidewall 412.

Figure 8:
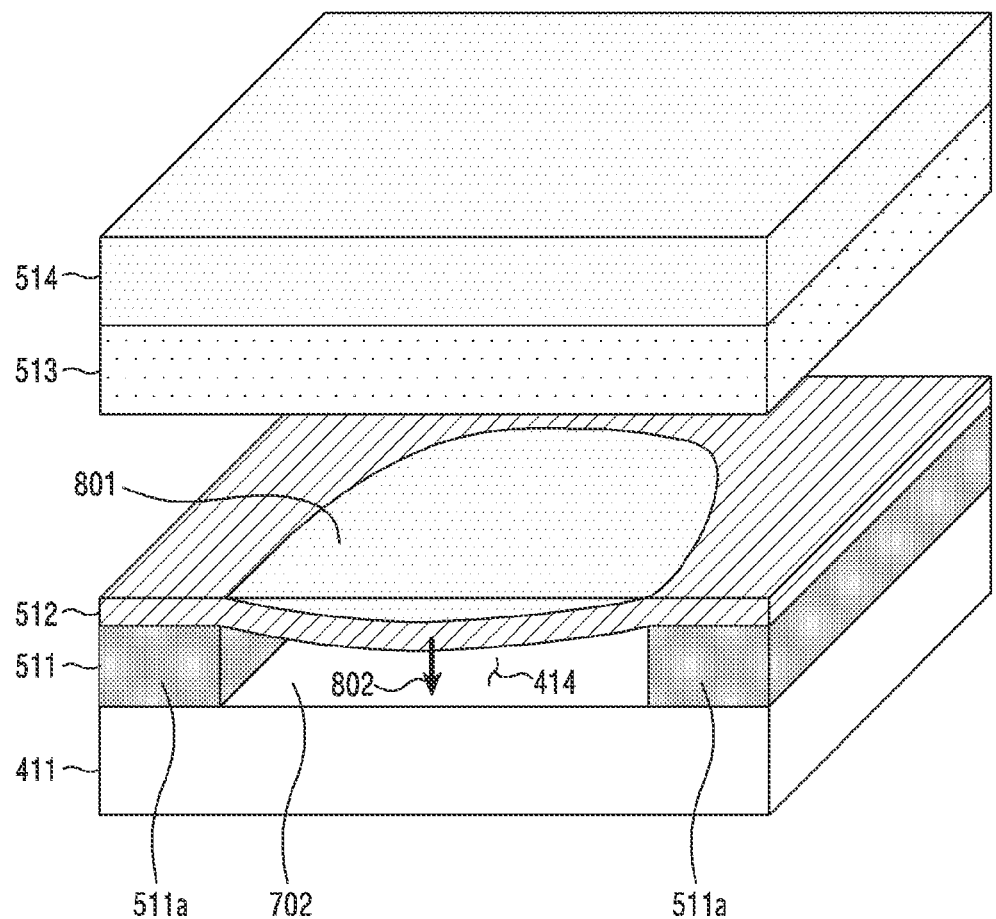
FIG. 8 illustrates a process of improving a flatness of an uppermost layer of a sidewall by using a filler according to an embodiment.

FIG. 8 illustrates a process of improving a flatness of an uppermost layer (e.g., the fourth layer 514) of a sidewall by using a filler according to an embodiment. The following process may be added in the midst of the second step of FIG. 7B.

FIG. 8 illustrates a cross-section including the air gap 702 of the sub PCB 410 of FIG. 6A and FIG. 6B.

In FIG. 8, since only a periphery region of the second layer 512 is supported by the periphery portion 511a of FIG. 7A of the first layer 511, an inner region of the second layer 512 may be sagged in a direction 802 of the air gap 702. If the flatness of the second layer 512 is low, the flatness of the third layer 513 and fourth layer 514 laminated on the second layer 512 may also be low. If the flatness of the fourth layer 514 is low, a bonding face with respect to a main PCB 430 is not uniform, which may negatively affect bonding between a sub PCB 410 and the main PCB 430.

Since a filler 801 such as ink is applied on the second layer 512 before the third layer 513 is laminated on the second layer 512, even if the second layer 512 is sagged in a direction 802 of the air gap 702 of the first layer 511, the flatness of the fourth layer 514 may maintain a specific level. The filler 801 may be applied to a region which is sagged in the downward direction 802 in the second layer 512 due to the air gap 702 of the first layer 511. The filler 801 added on the second layer 512 enables a face on which the third layer 513 and the fourth layer 514 are located to be uniform, thereby improving the flatness of the fourth layer 514. Since most of the filler 801 existing on the second layer 512 exists in a region corresponding to the air gap 702, the filler 801 may be removed in a process of forming a cavity 416 of a sub PCB 410.

In FIG. 7A and FIG. 7B, since the sidewall 412 is formed only on one face 414 of the base PCB 411, the sub PCB 410 may be formed asymmetrically. Since the sub PCB 410 is exposed to high heat or a relatively large temperature change during manufacturing, it may be vulnerable to deformation such as warpage when the sub PCB 410 is formed asymmetrically.

Two base PCBs may be coupled by using an adhesive member, and a layer having the same attribute may be added substantially simultaneously to each base PCB. If a first base PCB and a second base PCB are coupled by using a carrier tape, when a single-sided CCL is located at one face of the first base PCB, the same single-sided CCL may be located at one face of the second base PCB. In this case, although the respective base PCBs are asymmetrical, the entire structure in which the two base PCBs are coupled may be symmetric with respect to the adhesive member. Therefore, deformation occurring in a sub PCB may be minimized during the sub PCB is manufactured.

Figure 9A:
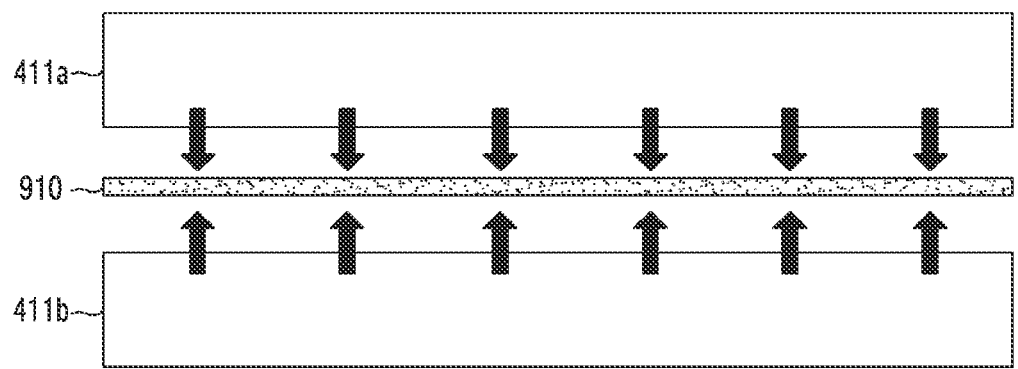
FIG. 9A illustrates a process of bonding two base PCBs through an adhesive member according to an embodiment.
Figure 9B:
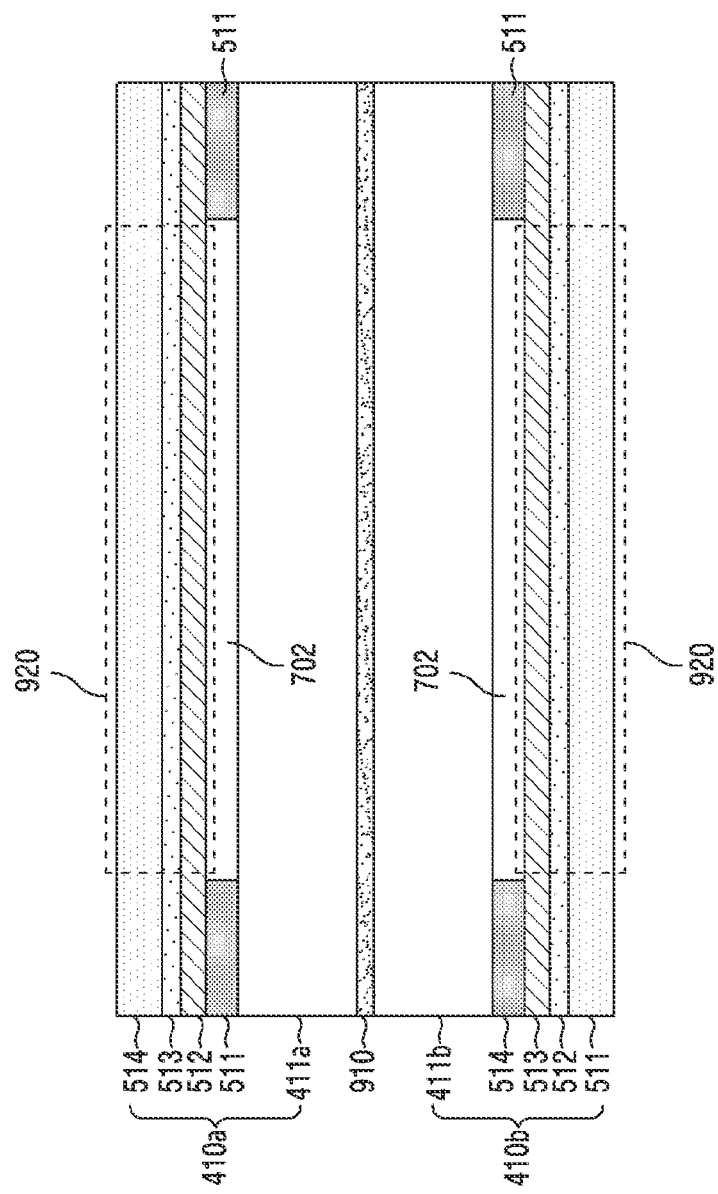
FIG. 9B illustrates a state in which a plurality of layers is symmetrically located on two base PCBs according to an embodiment.
Figure 9C:
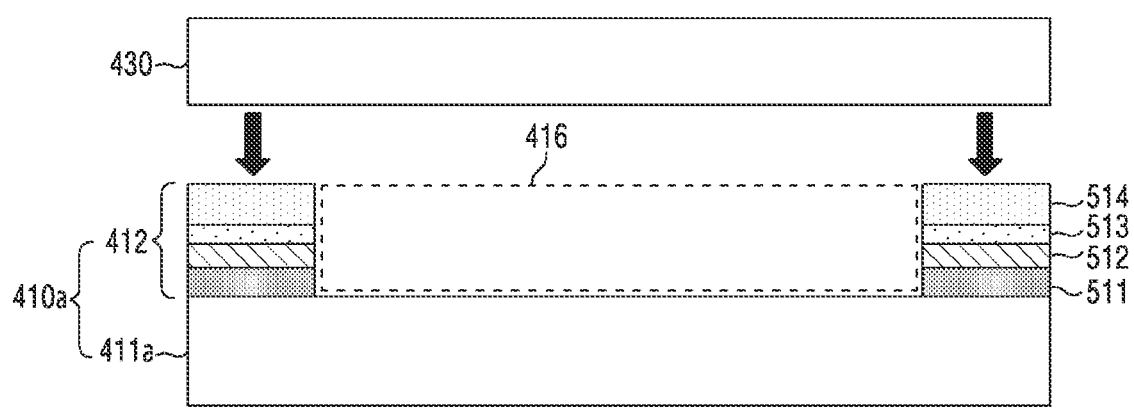
FIG. 9C illustrates a main PCB mounted or located on a sidewall of a first sub PCB after a cavity is formed on the first sub PCB according to an embodiment.

FIG. 9A and FIG. 9B illustrate a process of symmetrically manufacturing a pair of asymmetric sub PCBs 410 according to an embodiment. FIG. 9A illustrates a process of bonding the two base PCBs 411a and 411b through an adhesive member 910. FIG. 9B illustrates a state in which the plurality of layers 511, 512, 513, and 514 are symmetrically located on the two base PCBs 411a and 411b. FIG. 9C illustrates that the main PCB 430 is mounted or located on the sidewall 412 of the first sub PCB 410a after the cavity 416 is formed on the first sub PCB 410a.

Referring to FIG. 9A, the first base PCB 411a may be adhered or bonded to the second base PCB 411b through the adhesive member 910. Hereinafter, when PCBs are bonded to each other, this does not indicate that two PCBs are bonded integrally as an inseparable entity, but instead, that the two PCBs are bonded to be separable from each other at a later time. In addition, although it is described hereinafter that the two base PCBs 411a and 411b are bonded through an adhesive member, the disclosure is not limited thereto. That is, a PCB constructed of some layers constituting a base PCB may be symmetrically bonded to another PCB constructed of some identical layers through an adhesive member, and thereafter the remaining layers constituting the base PCB may be located. For example, referring to FIG. 6A, two base PCBs constructed of only the first layer 610 among the several layers 601, 602, 603, 604, and 605 constituting the base PCB 411 may be bonded with each other through an adhesive member. Thereafter, the second layer 602 to the fifth layer 605 may be sequentially laminated on the first layer 601 to constitute a base PCB including the first layer 601 to the fifth layer 605.

Referring to FIG. 9B, the plurality of layers 511, 512, 513, and 514 may be symmetrically located on the first base PCB 411a and the second base PCB 411b. The first sub PCB 411a and second sub PCB 411b of FIG. 9B may be when a conductive via 413, a sidewall 412, and a cavity 416 are not yet formed. The sub PCBs 410a and 410b of FIG. 9B may indicate a PCB when the sidewall or the cavity is not yet formed.

The first sub PCB 410a may include the first base PCB 411a and the first to fourth layers 511 to 514. The second sub PCB 410b may include the second base PCB 411b and the first to fourth layers 511 to 514.

After the first base PCB 411a is attached to the second base PCB 411b through an adhesive member 900, the first layer 511 may be located on the first base PCB 411a and the second base PCB 411b. After the first layer 511 is located, the second layer 512 to the fourth layer 514 may be located sequentially on the first base PCB 411a and the second base PCB 411b. Since the first layer 511 includes an opening 511b, when the second layer 512 is located on the first layer 511, the air gap 702 may be formed between the second layer 512 and the base PCBs 411a and 411b. Since the layers 511, 512, 513, and 514 located on each of the base PCBs 411a and 411b are symmetrically disposed with respect to the adhesive member 910, the entire structure in which the first sub PCB 410a and the second sub PCB 410b are combined may be symmetrical with respect to the adhesive member 910.

After all of the first layer 511 to the fourth layer 514 are laminated on the base PCBs 411a and 411b, the two sub PCBs 410a and 410b may be separated from each other by removing the adhesive member 910 used to bond the first sub PCB 410a and the second sub PCB 410b. After the first sub PCB 410a is separated from the second sub PCB 410b, the cavity 416 surrounded by the sidewall 412 may be formed on the first sub PCB 410a through a drill process. For example, a portion 920 corresponding to the air gap 702 in the second layer 512 to the fourth layer 514 may be removed through a laser drill to form the sidewall 411 and the cavity 416 surrounded by the sidewall 411.

Before the two sub PCBs 410a and 410b are separated from each other, the cavity 416 may be formed on each of the sub PCBs. All of the first layer 511 to the fourth layer 514 may be laminated on the base PCBs 411a and 411b to create the sub PCBs 410a and 410b when the cavity is not yet formed. In this case, the two sub PCBs 410a and 410b may be coupled by using the adhesive member 910 to form an integral entity. The portion 920 corresponding to the air gap 702 may be removed from the second layer 512 to the fourth layer 514 through a drill process when the two sub PCBs 410a and 401b are integrated through the adhesive member, thereby forming the sidewall 411 and the cavity 416 surrounded by the sidewall 411. Since the adhesive member 910 is removed after the cavity 416 is formed on the two sub PCBs 410a and 410b, the two sub PCBs 410a and 410b may be separated from each other.

FIG. 9C illustrates the first sub PCB 410a when the cavity 416 is formed. Referring to FIG. 9C, after the cavity 416 is formed on the first sub PCB 410a, the main PCB 430 may be mounted or located on the sidewall 412.

According to an embodiment, a PCB module may include a first PCB including a base PCB, a sidewall disposed on a periphery of the base PCB, a cavity surrounded by the sidewall, and conductive vias penetrating the sidewall, a second PCB disposed on the sidewall to cover a cavity formed by the sidewall of the first PCB, and at least one electronic component disposed inside the cavity and located on the first PCB and/or the second PCB. The sidewall may include a first layer disposed on an upper face of the base PCB and constructed of an insulating member, a second layer disposed on the first layer and including a polyimide, a third layer disposed on the second layer and constructed of an insulating member, and a fourth layer disposed on the third layer and including a conductive member conductive with respect to the conductive vias.

The second layer of the PCB module may include a polyimide layer and a conductive layer located on the polyimide layer.

The second layer of the PCB module may correspond to a single-sided FCCL constructed of the polyimide layer and a copper foil disposed on an upper face of the polyimide layer.

The first layer of the PCB module may be constructed of a low-flow prepreg.

The third layer of the PCB module may be constructed of a regular prepreg characterized by a higher flowability than the first layer.

The fourth layer of the PCB module may correspond to a single-sided CCL constructed of a regular prepreg layer and a copper foil disposed on the regular prepreg layer.

The second PCB of the PCB module may be surface-mounted on an upper face of the sidewall.

The first PCB of the PCB module may include a plurality of layers. The plurality of layers may include a center nd layers located symmetrically with respect to the center layer.

The plurality of layers of the PCB module may further include at least one layer symmetrical to at least one layer among layers constituting the sidewall with respect to the center layer.

The first layer of the PCB module may be constructed of a low-flow prepreg. The second layer may be a single-sided FCCL. The third layer may be constructed of a regular prepreg, and the fourth layer is a single-sided CCL.

According to an embodiment, a method of manufacturing a PCB module including a first PCB and a second PCB may include laminating a first layer including an opening on a base PCB, laminating a second layer of a cured state on the first layer, laminating a third layer constructed of a prepreg on the second layer, laminating a fourth layer including a conductive layer on the third layer, manufacturing the first PCB by removing a portion corresponding to the opening from the second layer to the fourth layer, and surface-mounting the second PCB on the fourth layer of the first PCB.

The first layer of the PCB module manufacturing method may be constructed of a low-flow prepreg.

The second layer of the PCB module manufacturing method may be a single-sided FCCL.

The third layer of the PCB module manufacturing method may be constructed of a regular prepreg characterized by a higher flowability than the first layer, and the fourth layer may be a single-sided CCL.

The base PCB of the PCB module manufacturing method may include a plurality of layers. The plurality of layers may include a center layer and layers located symmetrically with respect to the center layer.

The PCB module manufacturing method may further include laminating a firth layer constructed of the same material as the first layer below the base PCB, when the first layer is laminated on the base PCB.

The PCB module manufacturing method may further include laminating a sixth layer constructed of the same material as the second layer below the fifth layer, when the second layer is laminated on the first layer.

In the PCB module manufacturing method, removing of the second layer to fourth layer corresponding to the opening may be performed by using a laser.

In the PCB module manufacturing method, the removing of the second layer to fourth layer by using the laser may include forming a groove on the second layer by using the laser, and removing the second layer to fourth layer corresponding to the opening along the groove.

The PCB module manufacturing method may further include coating a filler to an inner region of the second layer before the third layer is laminated on the second layer.

While the disclosure has been particularly shown and described with reference to certain embodiments thereof, it will be understood by those skilled in the art that various changes in form and details may be made therein without departing from the scope of the subject matter as defined by the appended claims and their equivalents.

What is claimed is:

1. A printed circuit board (PCB) module comprising:
a first PCB comprising:
a base PCB,
a sidewall extending from an upper surface of the base PCB and disposed along a periphery of the upper surface of the base PCB, wherein at least one cavity surrounded by the sidewall disposed along the periphery of the upper surface is formed, and
conductive vias penetrating into both the sidewall and at least a portion of the base PCB;
a second PCB disposed on the sidewall to cover the at least one cavity surrounded by the sidewall of the first PCB; and
at least one electronic component disposed inside the at least one cavity and located on the first PCB and/or the second PCB,
wherein the sidewall comprises:
a first layer disposed on the upper surface of the base PCB and constructed of an insulating member;
a second layer disposed on the first layer and comprising a polyimide;
a third layer disposed on the second layer and constructed of an insulating member; and
a fourth layer disposed on the third layer and comprising a conductive member conductive with respect to the conductive vias.

2. The PCB module of claim 1, wherein the second layer comprises a polyimide layer and a conductive layer located on the polyimide layer.

3. The PCB module of claim 2, wherein the second layer corresponds to a single-sided flexible copper clad laminate (FCCL) constructed of the polyimide layer and a copper foil disposed on an upper face of the polyimide layer.

4. The PCB module of claim 2, wherein the first layer is constructed of a low-flow pre-impregnated with resin (prepreg) material.

5. The PCB module of claim 4, wherein the third layer is constructed of a regular prepreg having a higher flowability than the first layer.

6. The PCB module of claim 1, wherein the fourth layer corresponds to a single-sided copper clad laminate (CCL) constructed of a regular prepreg layer and a copper foil disposed on the regular prepreg layer.

7. The PCB module of claim 1, wherein the second PCB is surface-mounted on an upper face of the sidewall.

8. The PCB module of claim 1,
wherein the base PCB comprises a plurality of layers, and
wherein the plurality of layers comprises a center layer and layers located symmetrically with respect to the center layer.

9. The PCB module of claim 8, wherein the plurality of layers further comprises at least one layer symmetrical to at least one layer among layers constituting the sidewall with respect to the center layer.

10. The PCB module of claim 1, wherein the first layer is constructed of a low-flow prepreg material, the second layer is a single-sided FCCL, the third layer is constructed of a regular prepreg material, and the fourth layer is a single-sided CCL.

* * * * *